(12) United States Patent
Chan

(10) Patent No.: US 9,299,773 B2
(45) Date of Patent: Mar. 29, 2016

(54) SEMICONDUCTOR STRUCTURE AND METHOD FOR FORMING THE SAME

(75) Inventor: Wing-Chor Chan, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 9 days.

(21) Appl. No.: 13/400,509

(22) Filed: Feb. 20, 2012

(65) Prior Publication Data

US 2013/0214354 A1    Aug. 22, 2013

(51) Int. Cl.
| *H01L 29/66* | (2006.01) |
| *H01L 29/78* | (2006.01) |
| *H01L 29/06* | (2006.01) |
| H01L 29/423 | (2006.01) |
| H01L 29/08 | (2006.01) |

(52) U.S. Cl.
CPC ...... *H01L 29/0634* (2013.01); *H01L 29/66681* (2013.01); *H01L 29/7816* (2013.01); *H01L 29/0696* (2013.01); *H01L 29/0878* (2013.01); *H01L 29/42368* (2013.01)

(58) Field of Classification Search
CPC .............................. H01L 29/78; H01L 29/66
USPC .......... 257/335, 341, 343, 344; 438/270, 283, 438/478
See application file for complete search history.

(56) References Cited

U.S. PATENT DOCUMENTS

| 8,129,783 | B2 | 3/2012 | Huang et al. |
| 8,461,647 | B2 | 6/2013 | Chou et al. |
| 2006/0017102 | A1* | 1/2006 | Liu et al. ........................ 257/335 |
| 2008/0073666 | A1* | 3/2008 | Kao ................................. 257/133 |
| 2008/0237707 | A1* | 10/2008 | Suzuki et al. .................. 257/344 |
| 2009/0085101 | A1* | 4/2009 | Huang et al. ................... 257/328 |
| 2009/0256199 | A1* | 10/2009 | Denison et al. ................ 257/343 |
| 2010/0006935 | A1* | 1/2010 | Huang et al. ................... 257/341 |
| 2010/0102386 | A1* | 4/2010 | You ................................ 257/336 |
| 2011/0127607 | A1* | 6/2011 | Cai ................................. 257/339 |
| 2011/0220995 | A1* | 9/2011 | Chou et al. .................... 257/335 |
| 2013/0105892 | A1* | 5/2013 | Ren et al. ...................... 257/335 |

FOREIGN PATENT DOCUMENTS

| CN | 101162697 A | 4/2008 |
| CN | 102194873 A | 9/2011 |

OTHER PUBLICATIONS

CN Office Action dated Mar. 27, 2015 in corresponding Chinese application (No. 201210038549.0).

* cited by examiner

*Primary Examiner* — Kevin Parendo
*Assistant Examiner* — Ismail Muse
(74) *Attorney, Agent, or Firm* — McClure, Qualey & Rodack, LLP

(57) ABSTRACT

A semiconductor structure and a method for forming the same are provided. The semiconductor structure comprises a first semiconductor region, a second semiconductor region, a dielectric structure and a gate electrode layer. The first semiconductor region has a first type conductivity. The second semiconductor region has a second type conductivity opposite to the first type conductivity. The first semiconductor region is adjoined to the second semiconductor region. The dielectric structure is on the first semiconductor region and the second semiconductor region. The gate electrode layer is on the dielectric structure.

19 Claims, 5 Drawing Sheets

SEMICONDUCTOR STRUCTURE AND METHOD FOR FORMING THE SAME

BACKGROUND

1. Technical Field

The disclosure relates in general to a semiconductor structure and a method for forming the same and more particularly to a MOS device and a method for forming the same.

2. Description of the Related Art

In the semiconductor technology, the feature size has been reduced. In the meantime, the rate, the efficiency, the density and the cost per integrated circuit unit have been improved. Recently, a power-saving IC is a trend for development for a semiconductor structure. The power-saving IC usually uses a LDMOS or an EDMOS as a switch.

For example, a method for increasing a breakdown voltage (BVdss) of a semiconductor structure such as a LDMOS or an EDMOS is decreasing a dopant concentration of a drain region and increasing a drift length. However, a specific on-state resistance (Ron, sp) of the semiconductor structure is increased due to the method. Therefore, the BVdss and the Ron, sp can not be improved at the same time.

SUMMARY

A semiconductor structure is provided. The semiconductor structure comprises a first semiconductor region, a second semiconductor region, a dielectric structure and a gate electrode layer. The first semiconductor region comprises a first doped region and a second doped region. The first semiconductor region, the first doped region and the second doped region have a first type conductivity. The second semiconductor region comprises a third doped region. The second semiconductor region and the third doped region have a second type conductivity opposite to the first type conductivity. The second doped region is adjoined between the first doped region and the third doped region. The second doped region has a diffused doped portion extended from a top portion of the second doped region to the third doped region. The diffused doped portion has the first type conductivity. The dielectric structure is on the first semiconductor region and the second semiconductor region. The gate electrode layer is on the dielectric structure.

A method for forming a semiconductor structure is provided. The method comprises following steps. A first semiconductor region is formed in a substrate. The first semiconductor region comprises a first doped region and a second doped region. The first semiconductor region, the first doped region and the second doped region have a first type conductivity. A second semiconductor region is formed in the substrate. The second semiconductor region comprises a third doped region, the second semiconductor region and the third doped region have a second type conductivity opposite to the first type conductivity. The second doped region is adjoined between the first doped region and the third doped region. The second doped region has a diffused doped portion extended from a top portion of the second doped region to the third doped region. The diffused doped portion has the first type conductivity. A dielectric structure is formed on the first semiconductor region and the second semiconductor region. A gate electrode layer is formed on the dielectric structure.

The above and other aspects of the disclosure will become better understood with regard to the following detailed description of the non-limiting embodiment(s). The following description is made with reference to the accompanying drawings.

DETAILED DESCRIPTION

Figure 1:
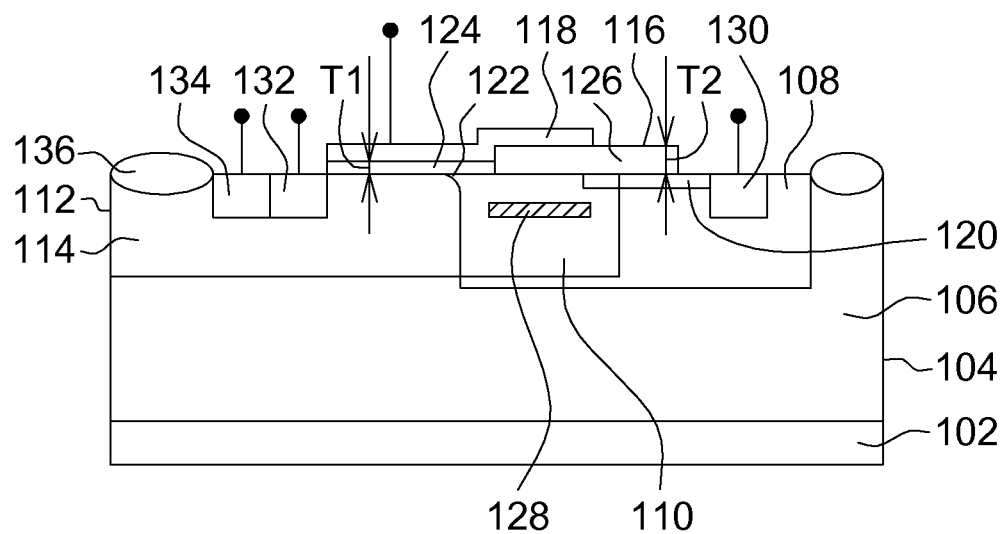
FIG. 1 to FIG. 4 illustrates a semiconductor structure and a method for forming the same according to one embodiment.

FIG. 1 illustrates a cross-section view of a semiconductor structure according to one embodiment. The semiconductor structure comprises a substrate 102. For example, the substrate 102 comprises a SOI, an epitaxial material or a non-epitaxial material, but is not limited thereto.

A first semiconductor region 104 is on the substrate 102. The first semiconductor region 104 may comprise a well region 106, a first doped region 108, a second doped region 110 and a top doped region 120. The top doped region 120 is formed in a top portion of the first doped region 108 and a top portion of the second doped region 110.

The well region 106, the first doped region 108, the second doped region 110 and the top doped region 120 have a first type conductivity such as N-type conductivity.

A second semiconductor region 112 comprises a third doped region 114. The third doped region 114 has a second type conductivity opposite to the first type conductivity, such as P-type conductivity. The third doped region 114 is adjoined to the first semiconductor region 104.

The second doped region 110 is adjoined between the first doped region 108 and the third doped region 114. In embodiments, the second doped region 110 has a diffused doped portion 122. The diffused doped portion 122 is extended from a top portion of the second doped region 110 to the third doped region 114. The diffused doped portion 122 has the first type conductivity such as N-type conductivity.

A field plate doped region 128 may be formed in the second doped region 110 of the first semiconductor region 104 under a dielectric structure 116. In embodiments, the field plate doped region 128 has the second type conductivity such as P-type conductivity.

A first heavily doped region 130 is formed in the first doped region 108 of the first semiconductor region 104. A second heavily doped region 132 and a third heavily doped region 134 are formed in the third doped region 114 of the second semiconductor region 112. The first heavily doped region 130 and the second heavily doped region 132 have the first type conductivity such as N-type conductivity. The third heavily doped region 134 has the second type conductivity such as P-type conductivity.

The dielectric structure 116 may be on the first doped region 108 and the second doped region 110 of the first semiconductor region 104, and the third doped region 114 of the second semiconductor region 112. The dielectric structure 116 may be between the first heavily doped region 130 and the second heavily doped region 132.

The dielectric structure 116 comprises a first dielectric layer 124 and a second dielectric layer 126. The first dielectric layer 124 is adjoined to the second dielectric layer 126. The first dielectric layer 124 and the second dielectric layer 126 may respectively comprise an oxide or a nitride, such as silicon oxide or silicon nitride, or other suitable high-K materials. For example, the first dielectric layer 124 or the second dielectric layer 126 may have an oxide-nitride-oxide (ONO) structure.

A gate electrode layer 118 may be on the first dielectric layer 124 and the second dielectric layer 126 of the dielectric structure 116. The gate electrode layer 118 may comprise a metal, a polysilicon, a metal silicide, or other suitable materials.

An isolation structure 136 is not limited to a FOX shown in FIG. 1. For example, the isolation structure 136 may be a shallow trench isolation (STI) or a deep trench isolation (DTI).

In some embodiments, the well region 106 of the first semiconductor region 104 is omitted. Therefore, the first doped region 108 and the second doped region 110 of the first semiconductor region 104 and the third doped region 114 of the second semiconductor region 112 are formed in the substrate 102.

In embodiments, the semiconductor structure is a MOS device, such as a LDMOS or an EDMOS. Particularly, in case of the first type conductivity being N-type conductivity and the second type conductivity being P-type conductivity, the semiconductor structure is a N-channel LDMOS or a N-channel EDMOS. On the contrary, in case of the first type conductivity being P-type conductivity and the second type conductivity being N-type conductivity, the semiconductor structure is a P-channel LDMOS or a P-channel EDMOS. The first heavily doped region 130 is used as a drain and is electrically connected to a drain electrode (bias). The second heavily doped region 132 is used as a source and is electrically connected to a source electrode (bias). The third heavily doped region 134 is used as a base and is electrically connected to a base electrode (bias). In some embodiments, the third heavily doped region 134 may be electrically connected to the source electrode (bias).

In embodiments, a net concentration of a first type conductivity dopant in the second doped region 110 in a drift region is smaller than a net concentration of a first type conductivity dopant of the first doped region 108. It can reduce a specific on-resistance (Ron,sp) of the device. The top doped region 120 formed in the second doped region 110 (drift region) can reduce the Ron,sp of the device. The field plate doped region 128 in the drift region forms a floating area, thus can increase a breakdown voltage (BVdss) of the device.

The second doped region 110 of the first semiconductor region 104 has the diffused doped portion 122 extended to the third doped region 114 of the second semiconductor region 112. Therefore, an effective channel length and a channel resistance are reduced.

In embodiments, the first dielectric layer 124 of the dielectric structure 116 has a uniform first thickness T1. The second dielectric layer 126 has a uniform second thickness T2. The first thickness T1 is smaller than the second thickness T2. In embodiments, the first dielectric layer 124 is used as a gate dielectric layer. The second dielectric layer 126 thicker than the first dielectric layer 124 and used as an insulating isolation can be used for increasing the breakdown voltage of the device. The second dielectric layer 126 thinner than the isolation structure 136 can reduce the Ron,sp of the device.

The first dielectric layer 124 and the second dielectric layer 126 have a flat coplanar bottom surface S. As compared to the comparative example in which the second dielectric layer is a FOX (not shown), the embodiment using the dielectric structure 116 can provide a shorter current path in the drift region of the device, thus has a lower Ron,sp.

Figure 2:
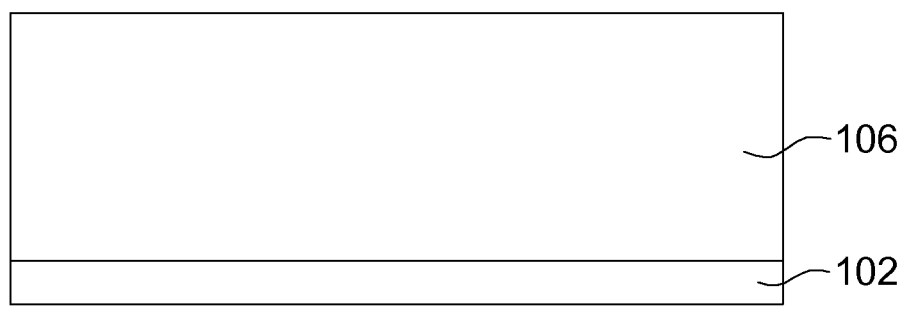

FIG. 1 to FIG. 4 illustrates a method for forming the semiconductor structure according to one embodiment. Referring to FIG. 2, the well region 106 is formed in the substrate 102 by a doping step.

Figure 3:
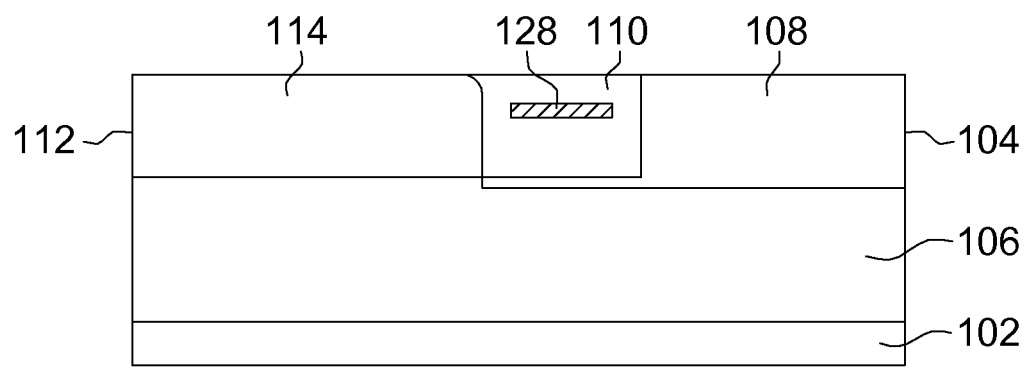

Referring to FIG. 3, the first semiconductor region 104 and the second semiconductor region 112 are respectively formed in the well region 106 by a doping step. An overlapping region between the first semiconductor region 104 and the second semiconductor region 112 is the second doped region 110. A sequence for forming the first semiconductor region 104 and forming the second semiconductor region 112 is not limited. In one embodiment, the first semiconductor region 104 is formed before the second semiconductor region 112 is formed. In another embodiment, the first semiconductor region 104 is formed after the second semiconductor region 112 is formed. After the first semiconductor region 104 and the second semiconductor region 112 are formed by a doping step, an annealing step is performed. The first type conductivity dopant such as N-type conductivity dopant of the first semiconductor region 104 and the second type conductivity dopant such as P-type conductivity dopant of the second semiconductor region 112 have different diffusing characteristics for the thermal diffusion step, it results in the diffused doped portion 122 of the second doped region 110 after the thermal diffusion step. The thermal diffusion step may be performed in any suitable timing after the first semiconductor region 104 and the second semiconductor region 112 are formed, such as before the field plate doped region 128 is formed, or after the gate electrode layer 118 (FIG. 4) is formed.

Referring to FIG. 3, next, the field plate doped region 128 is formed in the second doped region 110 by a doping step. In some embodiments, the well region 106 is omitted. Therefore, the first doped region 108 and the second doped region 110 of the first semiconductor region 104 and the third doped region 114 of the second semiconductor region 112 are formed in the substrate 102.

Figure 4:
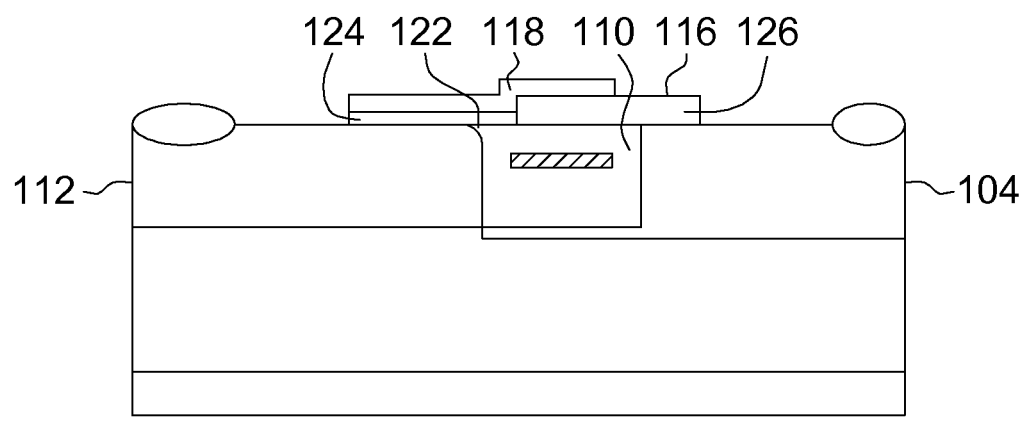

Referring to FIG. 4, the dielectric structure 116 is formed on the first semiconductor region 104 and the second semiconductor region 112. For example, the first dielectric layer 124 and the second dielectric layer 126 of the dielectric structure 116 may be formed by a thermal oxidation method or a deposition method such as a CVD method or a PVD method. In some embodiments, a lower portion of the second dielectric layer 126 is firstly formed, and then an upper portion of the second dielectric layer 126 is formed while the first dielectric layer 124 is formed. Referring to FIG. 4, a gate electrode layer 118 is formed on the dielectric structure 116.

Referring to FIG. 1, the top doped region 120 are formed in the first doped region 108 and the second doped region 110 of the first semiconductor region 104 by a doping step. The top doped region 120 may be formed by using the gate electrode layer 118 as a mask. The first heavily doped region 130 and the second heavily doped region 132 are formed in the first doped region 108 of the first semiconductor region 104 and the third doped region 114 of the second semiconductor region 112 by a doping step. The third heavily doped region 134 is formed in the third doped region 114 by a doping step.

The semiconductor structure in embodiments can be formed by a standard HV process. Therefore, an additional mask is not need, and the cost is decreased.

Figure 5:
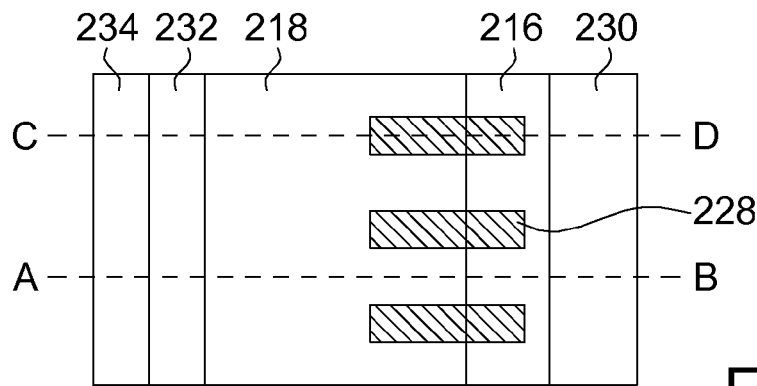
FIG. 5 illustrates a top view of a semiconductor structure according to one embodiment.
Figure 6:
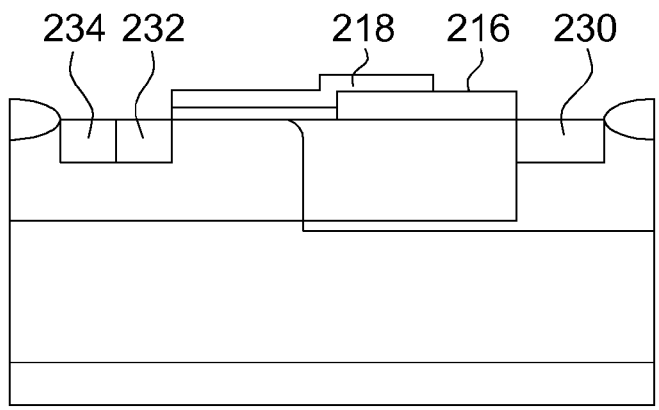
FIG. 6 illustrates a cross-section view of a semiconductor structure according to one embodiment.
Figure 7:
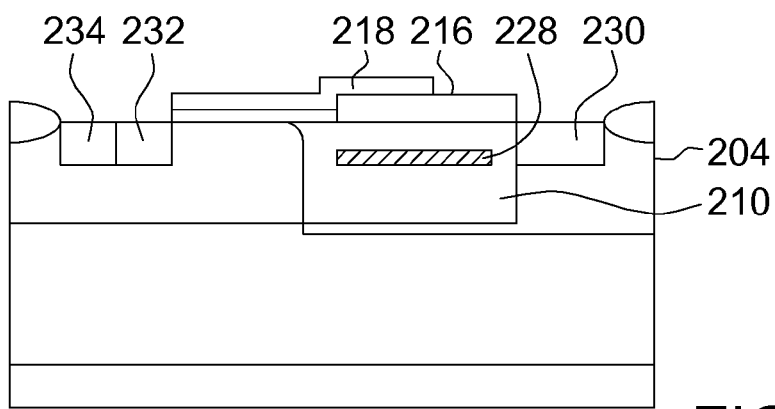
FIG. 7 illustrates a cross-section view of a semiconductor structure according to one embodiment.

FIG. 5 illustrates a top view of the semiconductor structure according to one embodiment. In some embodiments, the semiconductor structure along AB line has a cross-section view as shown in FIG. 6. The semiconductor structure along CD line has a cross-section view as shown in FIG. 7. Referring to FIG. 5 to FIG. 7, FIG. 5 only shows the dielectric structure 216, the gate electrode layer 218, the first heavily doped region 230, the second heavily doped region 232, the third heavily doped region 234 and the field plate doped region 228 of the semiconductor structure. Referring to FIG. 5 and FIG. 7, field plate doped regions 228 are separated from each other by the second doped region 210 of the first semiconductor region 204. In this case, the field plate doped region 228 has a strip shape (or rectangle shape, oblong shape. However, the present disclosure is not limited thereto. The field plate doped region 228 may have a comb shape, a hexagon shape, an octagonal shape, a spherical shape, or a square shape. The semiconductor structure as shown in FIG. 7 is different from the semiconductor structure as shown in FIG. 1 in that the top doped region 120 in FIG. 1 is omitted. In addition, the first heavily doped region 230 is adjacent to the second doped region 210 of the first semiconductor region 204.

Figure 8:
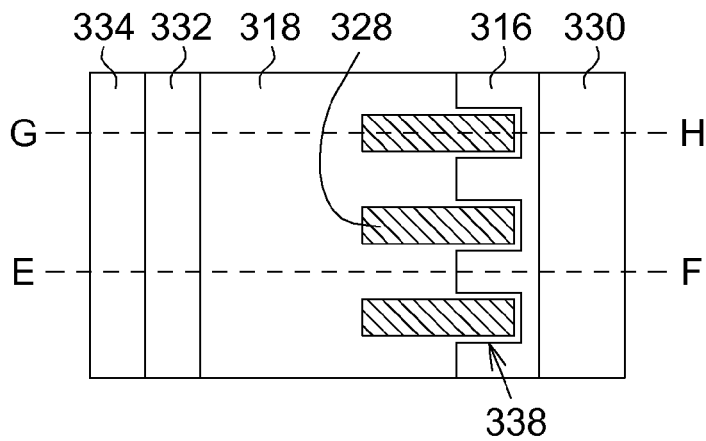
FIG. 8 illustrates a top view of a semiconductor structure according to one embodiment.
Figure 9:
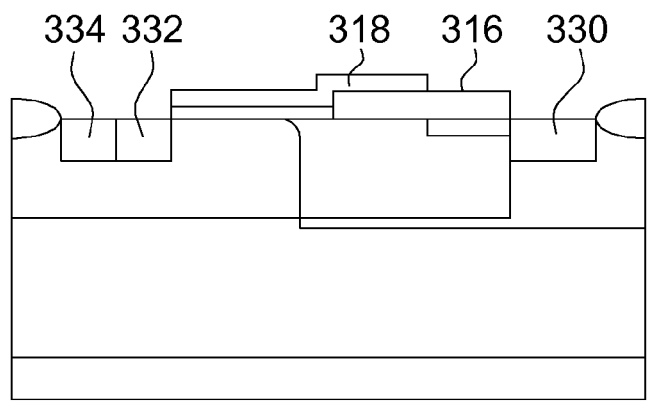
FIG. 9 illustrates a cross-section view of a semiconductor structure according to one embodiment.
Figure 10:
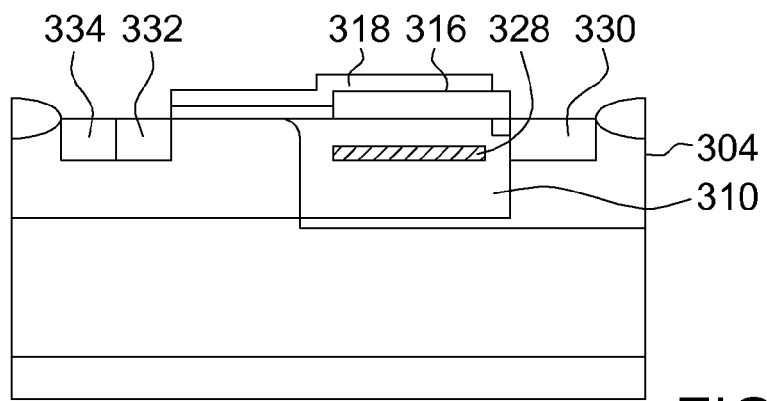
FIG. 10 illustrates a cross-section view of a semiconductor structure according to one embodiment.

FIG. 8 illustrates a top view of the semiconductor structure according to one embodiment. In some embodiments, the semiconductor structure along EF line has a cross-section view as shown in FIG. 9. The semiconductor structure along GH line has a cross-section view as shown in FIG. 10. Referring to FIG. 8 to FIG. 10, FIG. 10 only shows the dielectric structure 316, the gate electrode layer 318, the first heavily doped region 330, the second heavily doped region 332, the third heavily doped region 334 and the field plate doped region 328 of the semiconductor structure. The semiconductor structure as shown in FIG. 8 is different from the semiconductor structure as shown in FIG. 5 in that the gate electrode layer 318 has protrusive portion 338 separated from each other. The protrusive portions 338 are corresponded to the field plate doped regions 328. The protrusive portion 338 is not limited to a rectangle shape as shown in FIG. 8. For example, the protrusive portion 338 may have a curve shape, a triangle shape, or other suitable shapes. The semiconductor structure as shown in FIG. 10 is different from the semiconductor structure as shown in FIG. 1 in that, the first heavily doped region 330 is adjacent to the second doped region 310 of the first semiconductor region 304.

Figure 11:
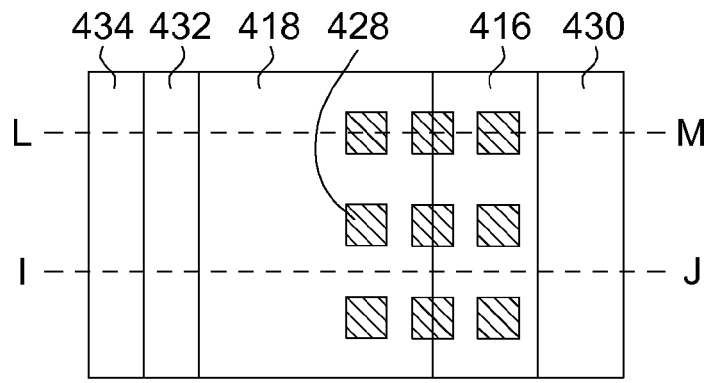
FIG. 11 illustrates a top view of a semiconductor structure according to one embodiment.
Figure 12:
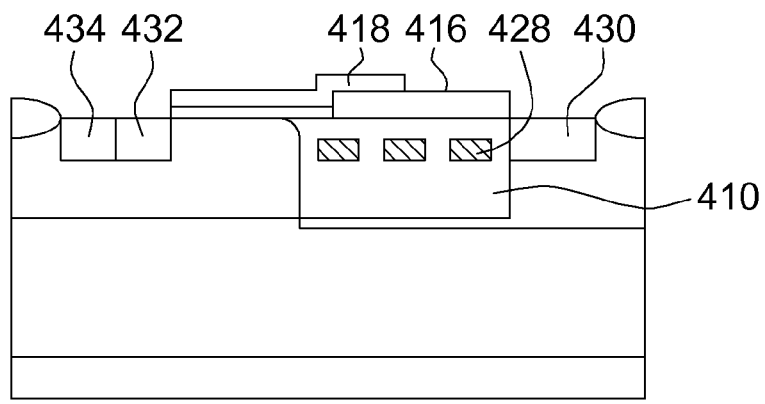
FIG. 12 illustrates a cross-section view of a semiconductor structure according to one embodiment.

FIG. 11 illustrates a top view of the semiconductor structure according to one embodiment. In some embodiments, the semiconductor structure along IJ line has a cross-section view as shown in FIG. 9. The semiconductor structure along LM line has a cross-section view as shown in FIG. 12. Referring to FIG. 11 and FIG. 12, FIG. 11 only shows the dielectric structure 416, the gate electrode layer 418, the first heavily doped region 430, the second heavily doped region 432, the third heavily doped region 434 and the field plate doped region 428 of the semiconductor structure. The semiconductor structure as shown in FIG. 11 and FIG. 12 is different from the semiconductor structure as shown in FIG. 5 and FIG. 7 in that the field plate doped region 428 are separated from each other laterally.

Figure 13:
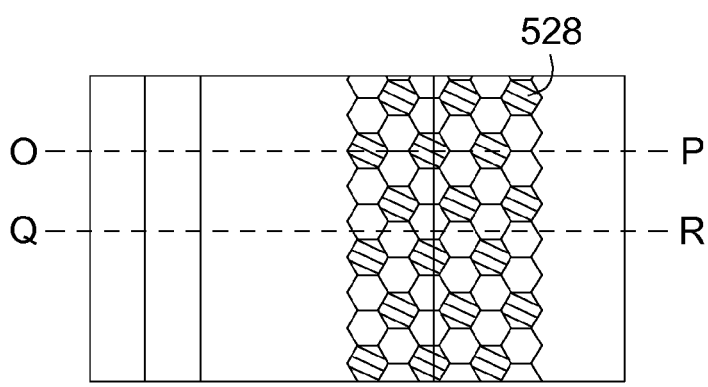
FIG. 13 illustrates a top view of a semiconductor structure according to one embodiment.

FIG. 13 illustrates a top view of the semiconductor structure according to one embodiment. In some embodiments, the semiconductor structure along OP line has a cross-section view similar to FIG. 12. The semiconductor structure along QR line has a cross-section view similar to FIG. 6. The semiconductor structure as shown in FIG. 13 is different from the semiconductor structure as shown in FIG. 11 in that the field plate doped region 528 has a comb shape (or hexagon shape). In other embodiments, the field plate doped region 528 may have a strip shape, a rectangle shape) (oblong shape or square shape), an octagonal shape, or a spherical shape.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a first semiconductor region comprising a first doped region and a second doped region, wherein the first semiconductor region, the first doped region and the second doped region have a first type conductivity;
   a second semiconductor region comprising a third doped region, wherein the second semiconductor region and the third doped region have a second type conductivity opposite to the first type conductivity, the second doped region is adjoined between the first doped region and the third doped region, the second doped region has a top sharp portion that protrudes away from the second doped region toward the third doped region protruded to the third doped region, the top sharp portion is a diffused doped portion having the first type conductivity;
   a dielectric structure on the first semiconductor region and the second semiconductor region;
   a gate electrode layer on the dielectric structure; and
   at least one field plate doped region formed in the first semiconductor region under the dielectric structure, wherein the field plate doped region is separated and has a distance from the dielectric structure, the field plate doped region is completely surrounded by the second doped region, and the field plate doped region has the second type conductivity;
   wherein the top sharp portion is disposed along a bottom surface of the dielectric structure, and a tip of the top sharp portion toward the third doped region is in direct contact with the bottom surface of the dielectric structure.

2. The semiconductor structure according to claim 1, wherein the first semiconductor region further comprises a top doped region formed in a top portion of the first doped region, the top doped region has the first type conductivity.

3. The semiconductor structure according to claim 1, where the first semiconductor region further comprises a top doped region formed in a top portion of the second doped region, the top doped region has the first type conductivity.

4. The semiconductor structure according to claim 1, wherein a net concentration a first type conductivity dopant of the second doped region is smaller than a net concentration of a first type conductivity dopant of the first doped region.

5. The semiconductor structure according to claim 1, wherein the dielectric structure is on the first doped region and the second doped region.

6. The semiconductor structure according to claim 1, wherein the dielectric structure comprises a first dielectric layer and a second dielectric layer, the first dielectric layer is adjoined to the second dielectric layer, and wherein the top sharp portion is disposed along a bottom surface of the first dielectric layer.

7. The semiconductor structure according to claim 6, wherein the first dielectric layer has a uniform first thickness, the second dielectric layer has a uniform second thickness, the first thickness is smaller than the second thickness.

8. The semiconductor structure according to claim 6, wherein the first dielectric layer and the second dielectric layer have a flat coplanar bottom surface.

9. The semiconductor structure according to claim 6, wherein the gate electrode layer is on the first dielectric layer and the second dielectric layer.

10. The semiconductor structure according to claim 1, wherein the field plate doped regions are separated from each other by the first semiconductor region.

11. The semiconductor structure according to claim 1, wherein the gate electrode layer has protrusive portions separated from each other, the protrusive portions are corresponded to the field plate doped regions.

12. The semiconductor structure according to claim 1, wherein the field plate doped region has a comb shape, a hexagon shape, a strip shape, a rectangle shape, an oblong shape, an octagonal shape, a spherical shape, or a square shape.

13. The semiconductor structure according to claim 1, wherein the gate electrode layer has protrusive portions separated from each other.

14. The semiconductor structure according to claim 1, further comprising a first heavily doped region and a second heavily doped region respectively formed in the first semiconductor region and the second semiconductor region, wherein the first heavily doped region and the second heavily doped region have the first type conductivity, the dielectric structure is between the first heavily doped region and the second heavily doped region.

15. The semiconductor structure according to claim 1, wherein the semiconductor structure is a LDMOS or EDMOS.

16. The semiconductor structure according to claim 1, wherein the first type conductivity is N-type conductivity, the second type conductivity is P-type conductivity.

17. A method for forming a semiconductor structure, comprising:
   forming a first semiconductor region in a substrate, wherein the first semiconductor region comprises a first doped region and a second doped region, the first semiconductor region, the first doped region and the second doped region have a first type conductivity;
   forming a second semiconductor region in the substrate, wherein the second semiconductor region comprises a third doped region, the second semiconductor region and the third doped region have a second type conductivity opposite to the first type conductivity, the second doped region is adjoined between the first doped region and the third doped region, the second doped region has a top sharp portion that protrudes away from the second doped region toward the third doped region protruded to the third doped region, the top sharp portion is a diffused doped portion having the first type conductivity;
   forming at least one field plate doped region in the first semiconductor region under the dielectric structure, wherein the field plate doped region has the second type conductivity;
   forming a dielectric structure on the first semiconductor region and the second semiconductor region; and
   forming a gate electrode layer on the dielectric structure;
   wherein the field plate doped region is separated and has a distance from the dielectric structure, and the field plate doped region is completely surrounded by the second doped region, and
   wherein the top sharp portion is formed along a bottom surface of the dielectric structure, and a tip of the top sharp portion toward the third doped region is in direct contact with the bottom surface of the dielectric structure.

18. The method for forming the semiconductor structure according to claim 17, wherein the dielectric structure comprises a first dielectric layer and a second dielectric layer adjoined to the first dielectric layer, the first dielectric layer has a uniform first thickness, the second dielectric layer has a uniform second thickness, the first thickness is smaller than the second thickness, wherein the top sharp portion is formed along a bottom surface of the first dielectric layer.

19. The method for forming the semiconductor structure according to claim 17, wherein the dielectric structure comprises a first dielectric layer and a second dielectric layer adjoined to the first dielectric layer, the first dielectric layer and the second dielectric layer have a flat coplanar bottom surface.

* * * * *